(12) United States Patent
Tam (10) Patent No.: US 12,149,803 B1
(45) Date of Patent: Nov. 19, 2024

(54) CAMERA MODULE WITH A FOLDED FLEXIBLE INTERCONNECT TAPE PACKAGE

(71) Applicant: Meta Platforms Technologies, LLC, Menlo Park, CA (US)

(72) Inventor: Samuel Tam, Dale City, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/884,837

(22) Filed: Aug. 10, 2022

(51) Int. Cl.
*H04N 23/50* (2023.01)
*H01R 12/59* (2011.01)

(52) U.S. Cl.
CPC ........... *H04N 23/50* (2023.01); *H01R 12/592* (2013.01)

(58) Field of Classification Search
CPC .............................. H04N 23/50; H01R 12/592
USPC .................................................. 348/373–375
See application file for complete search history.

(56) References Cited

U.S. PATENT DOCUMENTS

| | | | | |
|---|---|---|---|---|
| 5,027,255 | A * | 6/1991 | Zeitlin | H05K 1/14 257/E25.031 |
| 2004/0223072 | A1 * | 11/2004 | Maeda | H01L 27/14625 257/E31.127 |
| 2005/0001905 | A1 * | 1/2005 | Shinomiya | H04N 25/709 348/E5.025 |
| 2020/0321375 | A1 | 10/2020 | Wu | |
| 2024/0098348 | A1 | 3/2024 | Tam | |

OTHER PUBLICATIONS

Non-Final Office Action mailed Mar. 26, 2024 for U.S. Appl. No. 17/870,581, filed Jul. 21, 2022, 15 pages.

* cited by examiner

*Primary Examiner* — Lin Ye
*Assistant Examiner* — Chan T Nguyen
(74) *Attorney, Agent, or Firm* — Freestone Intellectual Property Law PLLC; Aaron J. Visbeek (57) ABSTRACT

A camera module includes an image sensor die, high-density interconnect (HDI) tape, and a number of passive electronic components. The image sensor die has a first side and a second side. The first side includes a pixel array, and the second side is opposite the first side. The HDI tape is a flexible substrate coupled to the image sensor. The HDI tape is at least partially folded or bent around the image sensor to couple to the HDI tape to the first and second sides of the image sensor die. The passive electronic components are coupled to the second side of the HDI tape and provide rigidity to the camera module.

20 Claims, 10 Drawing Sheets

CAMERA MODULE WITH A FOLDED FLEXIBLE INTERCONNECT TAPE PACKAGE

TECHNICAL FIELD

This disclosure relates generally to camera modules and in particular to camera module fabrication.

BACKGROUND INFORMATION

Various wearable products include cameras. As smaller and lighter-weight product designs emerge, product manufacturers are requesting increasingly smaller camera sizes.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and fabrication method for a camera module with flexible interconnect tape folded around an image sensor die are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Next generation products will be designed for camera modules that have smaller dimensions. Camera module dimensions may include stack height, length, and width. Examples of products that may benefit from smaller camera modules may include augmented reality (AR) glasses and virtual reality (VR) glasses.

A camera module's physical package dimensions may be reduced from those of existing cameras, by fabricating the camera module using high-density interconnect (HDI) tape folded around an image sensor die that is configured for wire bonding. The camera module includes an image sensor die, a segment of HDI tape folded around the image sensor die, and passive electronic components coupled together to form the camera module, according to an embodiment.

The HDI tape may be coupled to multiple sides of the image sensor die. The HDI tape may be folded or bent around a portion of the image sensor die to couple the HDI tape to a first and second side of the image sensor die. The HDI tape may include an opening that functions as a window for the pixel array to receive light through the HDI tape. The HDI tape may be a flexible interconnect tape having an image sensor end, a connector end, and a flexible interconnect section. The HDI tape may include traces that extend from the image sensor end to the connector end through the flexible interconnect section. The traces electrically couple the image sensor to a connector to enable external circuitry to access or communicate with the image sensor die. The HDI tape may include flexible insulator layers (e.g., 2 layers, 4 layers, 6 layers, etc.) that enclose the traces. The flexible insulator layers may include flexible polymer films. The connector may be coupled to the HDI tape and may include a number of connection pads.

The image sensor die may be electrically coupled to a first surface (e.g., a top surface or inside surface) of the HDI tape with bonding bumps. The bonding bumps may be gold stud bumps or gold plated stud bumps. The bonding bumps may be used to couple bonding pads of the image sensor die to exposed portions of traces of the HDI tape. The image sensor die may be a wire bond die having bonding pads on the same side (or surface) as a pixel array of the image sensor die. The image sensor die may be bonded to the HDI tape using flip chip die bonding techniques. For example, by wrapping a portion of the HDI tape over the bonding pads of the image sensor die, thermo-sonic (TS) bonding or thermo-compression (TC) bonding may be applied to electrically couple the image sensor die to traces within the HDI tape. Molding may be applied around a periphery of at least part of the image sensor die to protect the image sensor die. The molding and HDI tape may be sized to approximately the same footprint (e.g., length and width) of the image sensor die to maintain reduced dimensions of the overall camera module package.

The passive electronic components may be coupled to a second surface (e.g., a bottom surface) of the HDI tape. The location of the passive electronic components may be just opposite to the image sensor die on the HDI tape, so that the image sensor die and the passive electronic components are on the image sensor end of the HDI tape. The passive electronic components may include resistors, capacitors, inductors, and diodes, for example. The passive electronic components may be electrically coupled to the HDI tape using, for example, a solder paste. The passive electronic components may be covered with a layer of molding. The layer of molding may physically couple the electronic components to the HDI tape and may provide protection to the components. The layer of molding may add rigidity to the image sensor end of the camera module and may thermally conduct and dissipate heat from the image sensor die and the passive electronic components.

The apparatus, system, and method of fabrication for a camera module with folded flexible interconnect tape are described in this disclosure and enable manufacture of a low profile camera module to support operations of, for example, AR and VR glasses. These and other embodiments are described in more detail in connection with FIGS. 1A-5.

Figure 1A:
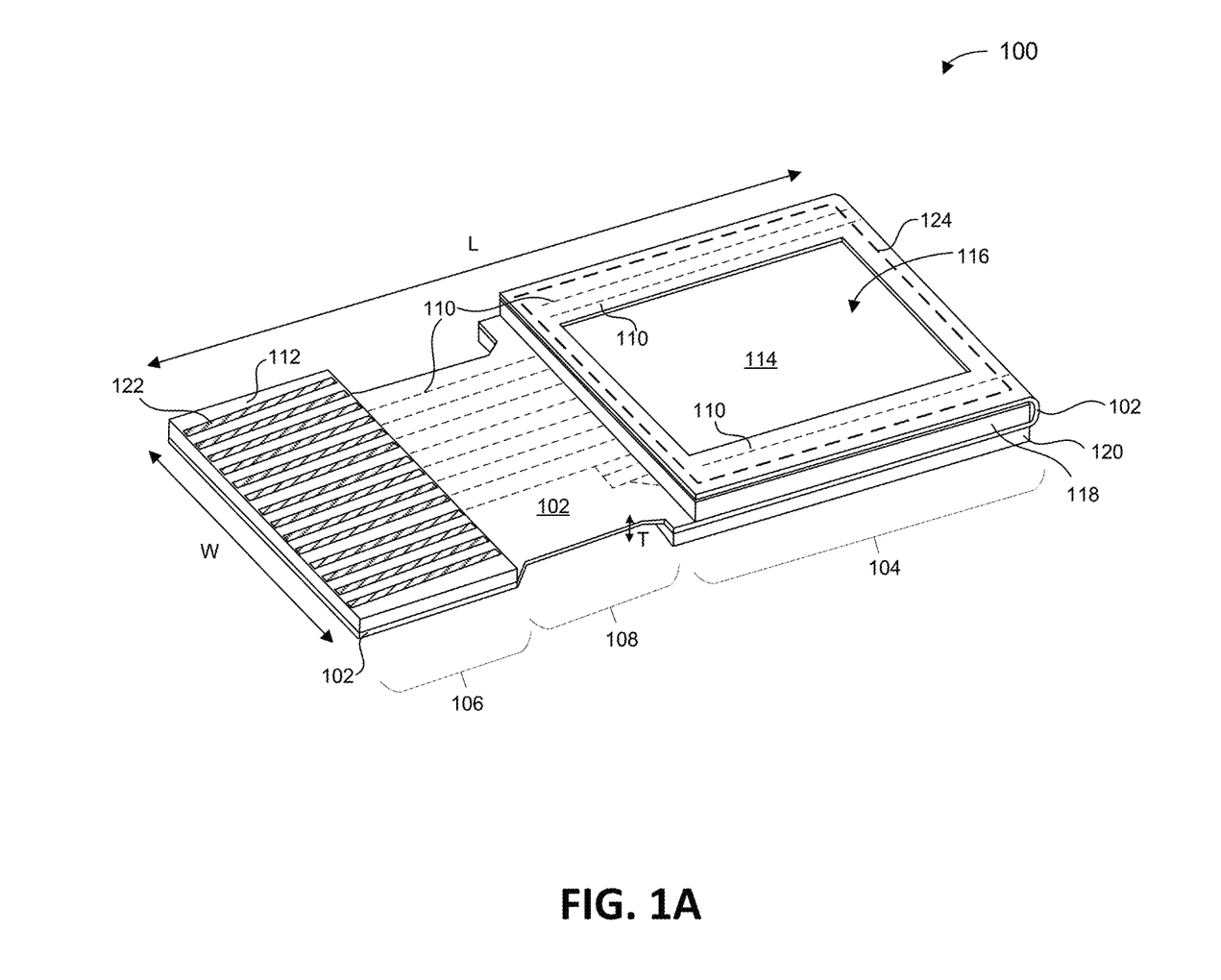
FIG. 1A illustrates a perspective view of a camera module that is fabricated with flexible interconnect tape, in accordance with aspects of the disclosure.

FIG. 1A illustrates a perspective view of a camera module 100 that is fabricated with flexible interconnect tape 102, in accordance with aspects of the disclosure. Flexible interconnect tape 102 is folded or bent around a portion of an image sensor die 124 to at least partially enclose image sensor die 124, according to an embodiment. Flexible interconnect tape 102 is folded around a portion of image sensor die 124 to enable bonding to a wire bond image sensor die using flip chip die bonding techniques, such as thermo-sonic (TS) bonding or thermo-compression (TC) bonding. Camera module 100 is configured to provide a small footprint that is approximately the same as the footprint of an image sensor die to support, for example, head mounted display (HMD) applications, according to an embodiment. Camera module 100 includes a sensor end 104, a connector end 106, and a flexible interconnect section 108 that couples sensor end 104 to connector end 106, according to an embodiment. Implementations of camera module 100 provide a small-sized, lightweight, and low-profile package that can be fabricated from existing wire bond image sensor dice. Flexible interconnect tape 102 extends from an image sensor end 104 to a connector end 106, and flexible interconnect section 108 couples image sensor end 104 to connector end 106, using flexible interconnect tape 102, according to an embodiment.

Flexible interconnect tape 102 is configured to electrically couple, one or more electronic components to one or more other electronic components, according to an embodiment. Flexible interconnect tape 102 may be implemented as a segment of high-density interconnect (HDI) tape, according to an embodiment. Flexible interconnect tape 102 includes a thickness T, a width W, and a length L. Length L may refer to a length of camera module 100, or length L may refer to the length of flexible interconnect tape 102, which includes a portion that is folded back over image sensor die 124. Thickness T may be approximately 0.07 mm to 0.18 mm. Thickness T of flexible interconnect tape 102 may vary based on a number of layers (e.g., 2 layers, 4 layers, 6 layers, etc.) from which it is fabricated. For example, flexible interconnect tape 102 may include a top layer and a bottom layer that enclose a number of traces 110. The layers may be flexible insulator layers of that include, for example, flexible polymer films. Flexible interconnect tape 102 may include 2 layers, 4 layers, 6 layers, or more layers to enclose and sandwich one or more of layers of traces 110. Traces 110 couple image sensor end 104 to connector end 106, according to various embodiments. Width W of flexible interconnect tape 102 may vary from one end to another. Width W of flexible interconnect tape 102 may be a width of a connector 112 on connector end 106, may be a width of flexible interconnect section 108, and may be a width of image sensor die 124 on image sensor end 104, according to various embodiments. Length L may include a length of image sensor end 104 (e.g., a length or width of an image sensor die), plus a length of connector 112, plus a length of flexible interconnect section 108.

Camera module 100 includes a partially enclosed image sensor die 124 coupled to flexible interconnect tape 102 on sensor end 104, according to an embodiment. Image sensor die 124 includes a pixel array 114 that may be exposed by an opening 116. Opening 116 may be an aperture in flexible interconnect tape 102. Opening 116 may be formed in a portion of flexible interconnect tape 102 that is wrapped over a pixel array side (e.g., top side) of image sensor die 124. Partially enclosing image sensor die 124 by wrapping flexible interconnect tape 102 over image sensor die 124 may be performed to enable bonding between bonding pads on the pixel array side image sensor die 124 (shown in FIGS. 1B and 1C), according to an embodiment. Bonding the bonding pads directly to a substrate (e.g., flexible substrate) may be referred to as flip chip bonding. Hence, wrapping flexible interconnect tape 102 over image sensor die 124 to bond to bonding pads enables a flip chip type of bonding to a wire bond die while providing a window through which pixel array 114 may receive light, according to an embodiment. Additionally, the stack height of passive electronic components, flexible interconnect tape 102, and image sensor die 124 is reduced over traditional camera modules.

Molding 118 may be disposed on flexible interconnect tape 102 and at least partially around image sensor die 124. Molding 118 is disposed around, for example, at least part of the periphery of image sensor die 124 to protect and immobilize image sensor die 124, according to an embodiment. Molding 118 may be applied using transfer molding processes, and molding 118 may include molding materials such as: acrylic, acrylonitrile butadiene styrene (ABS), nylon polyamide (PA), polycarbonate (PC), polyethyelene (PE), polyoxymethylene (POM), polypropylene (PP), polystyrene (PS), thermoplastic elastomer (TPE), and thermoplastic polyurethane (TPU), according to various embodiments. Molding 118 is disposed between folded over portions of flexible interconnect tape 102, according to an embodiment.

Camera module 100 includes a molding 120 that is applied to a second surface (e.g., a bottom surface) of flexible interconnect tape 102 on image sensor end 104, according to an embodiment. Molding 120 at least partially encapsulates a number of electronic components that are coupled to the second surface of flexible interconnect tape 102. Molding 120 provides rigidity to image sensor end 104, protects image sensor die 124 from being bent or broken, and provides thermal dissipation away from the electronic components, in an embodiment. The electronic components may be passive electronic components and may include resistors, capacitors, inductors, and diodes, for example.

Connector end 106 includes a portion of flexible interconnect tape 102, connector 112, and a number of pads 122. Pads 122 are electrically conductive pads that are coupled to traces 110. Pads 122 are electrically coupled to image sensor die 124 and provide an external interface to various connections of image sensor die 124 (e.g., power, ground, data, communications, configuration, diagnostics, etc.), according to an embodiment.

Figure 1B:
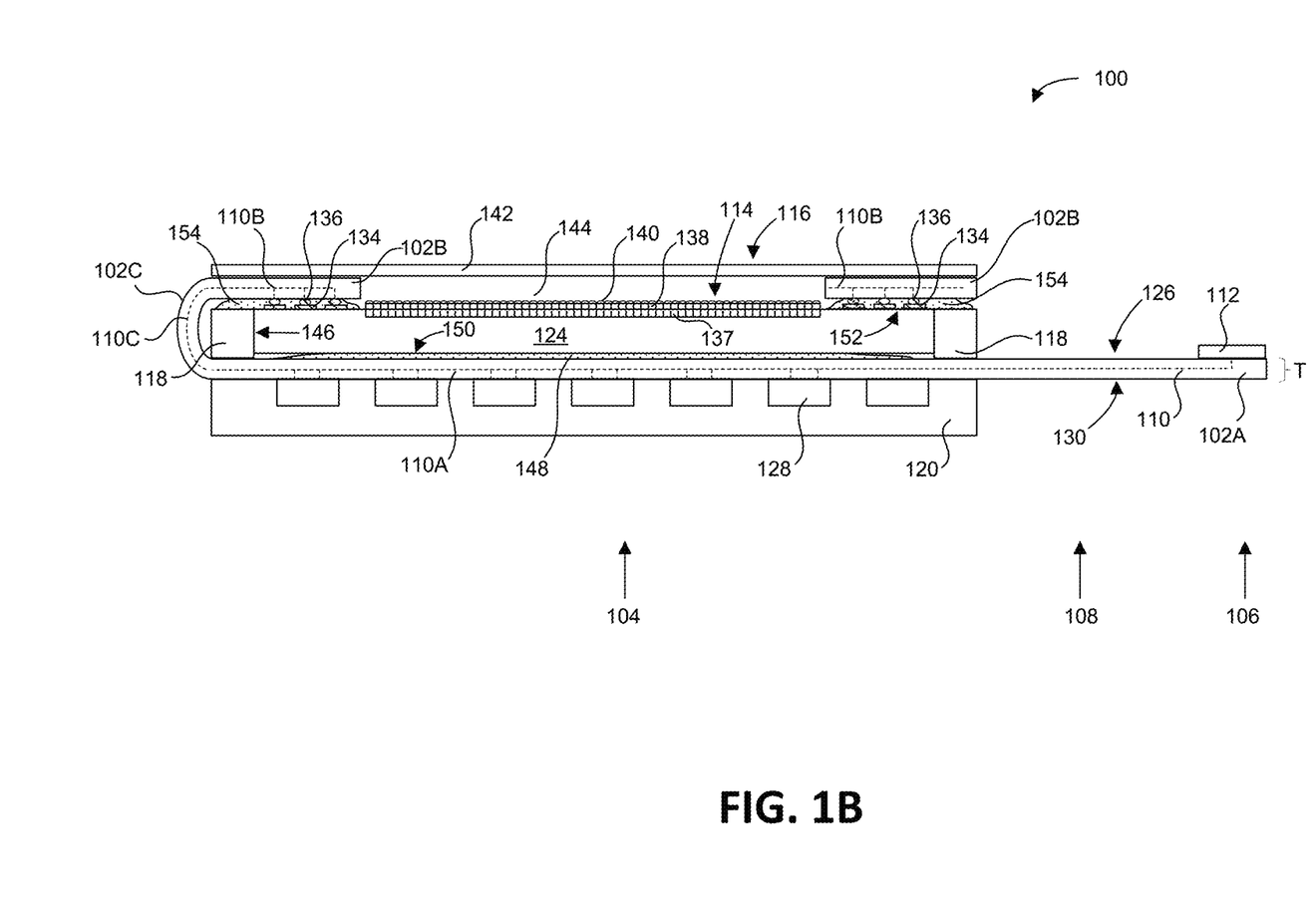
FIG. 1B illustrates a cross-sectional side view of camera module that is fabricated with flexible interconnect tape, in accordance with aspects of the disclosure.

FIG. 1B illustrates a cross-sectional side view of camera module 100, in accordance with aspects of the disclosure. In FIG. 1B, the electronic components of camera module 100 are illustrated as electronic components 128, according to an embodiment. Image sensor die 124 is coupled to a first side (or surface) 126 of flexible interconnect tape 102, and electronic components 128 are coupled to a second side (or surface) 130 of flexible interconnect tape 102, according to an embodiment.

Image sensor die 124 is a wire bond die that is coupled to flexible interconnect tape 102 using flip chip die bonding techniques, according to an embodiment. Flip chip bonding may refer to coupling bonding pads to a substrate (e.g., flexible interconnect tape 102) with a number of bonding bumps (e.g., gold stud bumps, solder balls, gold plated stud bumps, etc.), for example. Typically, a wire bond die would need bonding wires coupled from the top surface bonding pads (with a small loop) to a substrate (e.g., a printed circuit board). However, wire bonding increases the stack height of a camera module because bonding wires typically require a small loop near the bonding pad to maintain space/isolation between the bonding wire and traces of the die surface. The flip chip die bonding technique of the disclosure uses a folded flexible interconnect tape 102 to bond to the bonding pads, which may reduce wasted space that may be caused through wire bonding techniques.

Flexible interconnect tape 102 includes flexible interconnect tape 102A, 102B, and 102C. Flexible interconnect tape 102A represents the portion of flexible interconnect tape 102 that runs along a bottom side 150 (e.g., opposite side of the pixel array side) of image sensor die 124. Flexible interconnect tape 102B represents the portion of flexible interconnect tape 102 that runs along a top side 152 (e.g., pixel array side) of image sensor die 124. Flexible interconnect tape 102C represents the portion of flexible interconnect tape 102 that is folded or bent around a peripheral side 146 of image sensor die 124. Traces 110 include traces 110A, 110B, and 110C that correspond with portions of the traces 110 that also extend along the bottom, top, and peripheral side 146 of image sensor die 124, according to an embodiment. For bonding to image sensor die 124, traces 110B may be exposed on first side 126 of flexible interconnect tape 102B at the locations of bonding pads 134.

Image sensor die 124 may have multiple sides coupled to interconnect tape 102, according to an embodiment. Image sensor die 124 may be adhered to interconnect tape 102A with thin adhesive layer 148 to immobilize image sensor die 124. Adhesive layer 148 may be dispensed by thermo-set/thermo-plastic adhesive. Bottom side 150 is the non-pixel array side of image sensor die 124, and bottom side 150 may be adhered to flexible interconnect tape 102A with adhesive layer 148, according to an embodiment. Top side 152 is the pixel array side of image sensor die 124, and top side 152 may be bonded to flexible interconnect tape 102B using a number of bonding bumps 136 coupled to bonding pads 134, according to an embodiment. Bonding bumps 136 may be aligned with exposed portions of traces 110B to electrically couple traces 110B to bonding pads 134. Bonding bumps 136 may include gold stud bumps, gold plated stud bumps, or other bumps that are compatible with TS bonding or TC bonding, according to an embodiment. Image sensor die 124 is TS bonded or TC bonded to flexible interconnect tape 102 (e.g., flexible interconnect tape 102B) by applying heat and ultrasonic waves (e.g., TS bonding) or by applying heat and compressive force (e.g., TC bonding).

An underfill layer 154 may be applied between flexible interconnect tape 102B and top side 152. For TS bonding, underfill layer 154 may be an underfill material that provides support around bonding bump 136. For TC bonding, underfill layer 154 may be an adhesive such as non-conductive paste (NCP). In some implementations, anisotropic conductive paste (ACP) or a conductive epoxy may be used to bond traces 110B to bonding bumps 136 and bonding pads 134.

Image sensor die 124 includes pixel array 114, and pixel array 114 may include a number of components. Pixel array 114 may include a number of pixels 137 that are each individually configured to convert light into electrical signals that can be transferred to traces 110. Pixels 137 in pixel array 114 may be covered by a color filter array (CFA) 138 (e.g., red, green, blue) and microlenses 140, according to an embodiment. CFA 138 may be configured to filter/pass particular wavelengths of light, and microlenses 140 may be configured to focus incident light upon individual ones of pixels 137 in pixel array 114.

Electronic components 128 and molding 120 are configured to support operation of image sensor die 124 and are configured to provide rigidity to camera module 100, according to an embodiment. Electronic components 128 and molding 120 are configured to support operation and reduce the likelihood of damage (e.g., bending, breaking) to image sensor die 124, according to an embodiment. Electronic components 128 are coupled to traces 110A that are accessible and exposed on second side 130 of flexible interconnect tape 102A, according to an embodiment. Electronic components 128 may be passive components and may include, but are not limited to, capacitors, resistors, inductors, and diodes, according to an embodiment. Molding 120 may thermally conduct heat away from electronic components 128, away from flexible interconnective tape 102, and away from image sensor die 124, according to an embodiment. Molding 120 may be configured to dissipate heat transferred from electronic components 128, flexible interconnective tape 102, and image sensor die 124, according to an embodiment.

Camera module 100 may include cover glass 142 that is configured to at least partially cover image sensor die 124, according to an embodiment. Cover glass 142 may be coupled or adhered to flexible interconnect tape 102 to cover and protect pixel array 114, according to an embodiment. Cover glass 142 may be configured to create an air gap 144 between pixel array 114 and cover glass 142. Air gap 144 defined by cover glass 142 may protect pixel array 114 from dirt, dust, or other obstacles.

Figure 1C:
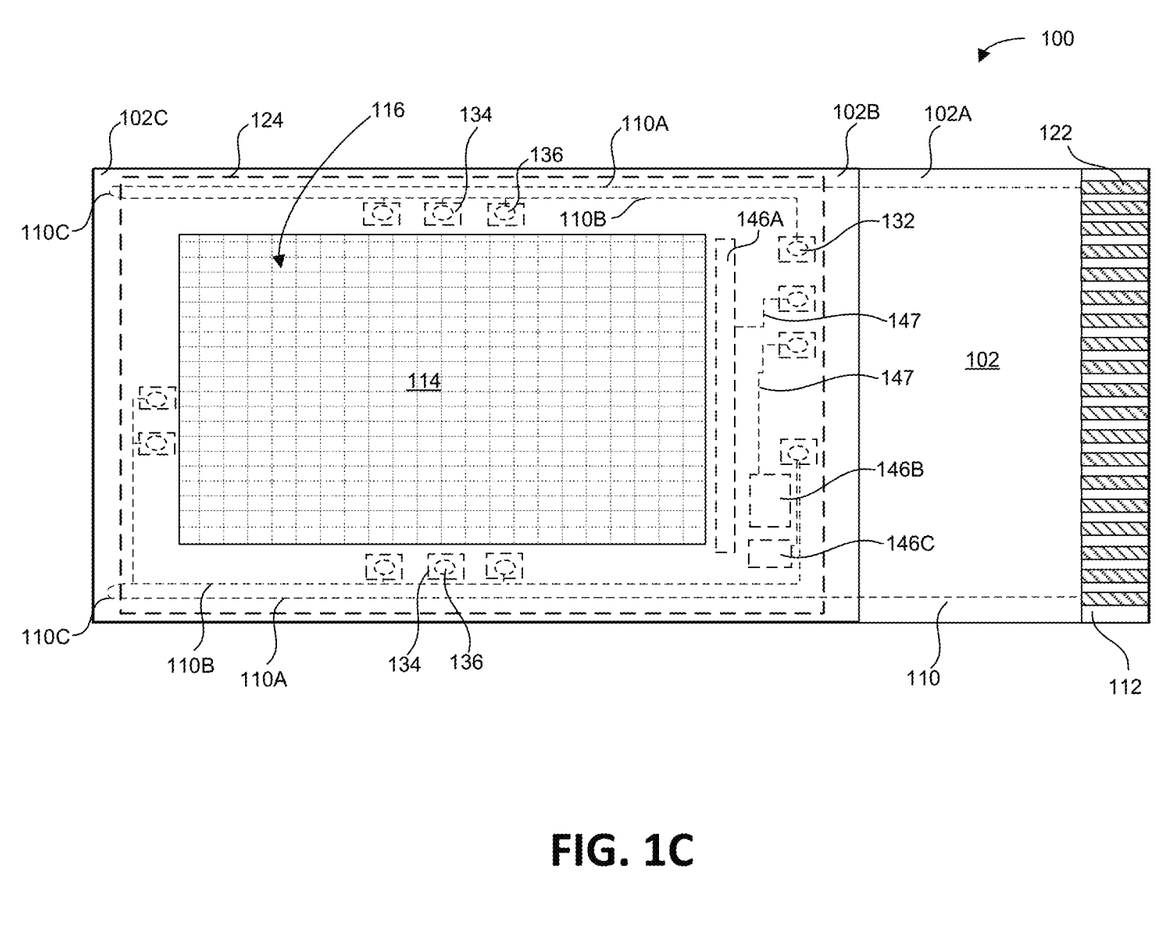
FIG. 1C illustrates an example plan view of camera module that is fabricated with flexible interconnect tape, in accordance with aspects of the disclosure.

FIG. 1C illustrates an example plan view of camera module 100, in accordance with aspects of the disclosure. As illustrated, bonding pads 134 and bonding bumps 136 may be distributed around a periphery of pixel array 114. Bonding pads 134 may be coupled to various components 146 (individually, component 146A, 146B, and 146C) of image sensor die 124. Examples of components 146 may include pixel array readout circuitry, processing circuitry, volatile memory, non-volatile memory, driver circuitry, etc. Bonding pads 134 may be coupled to components 146 with on-chip traces 147, for example. On-chip traces 147 may be conductive channels that are on and within image sensor die 124. On-chip traces 147, bonding pads 134, bonding bumps 136, and traces 110 provide electrical coupling between pads 122 and components 146 to enable external access to features (e.g., data lines, clock signals, communication channels, etc.) of image sensor die 124, according to an embodiment.

FIGS. 2A-2H illustrate a process of fabricating camera module 100 using flexible interconnect tape 102 folded around image sensor die 124, in accordance with aspects of the disclosure.

Figure 2A:
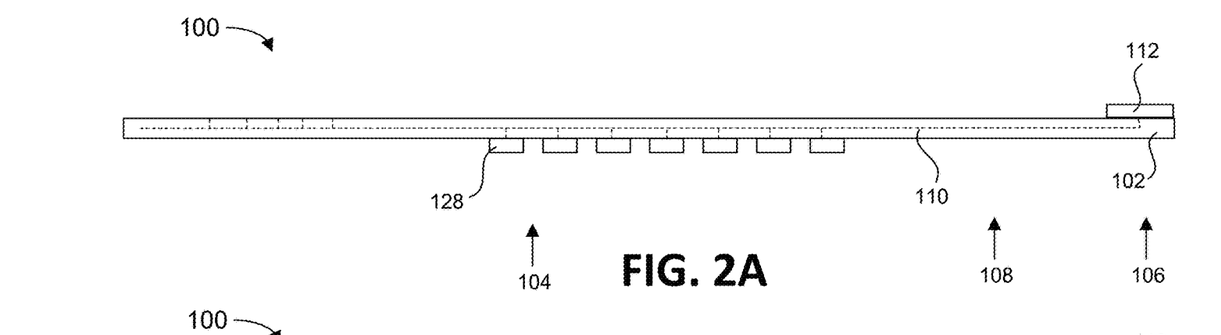
FIGS. 2A-2H illustrate a process of fabricating camera module using flexible interconnect tape, in accordance with aspects of the disclosure.

FIG. 2A illustrates mounting electronic components 128 to flexible interconnect tape 102, according to an embodiment. An advantage of using flexible interconnect tape 102 (e.g., HDI tape) is the ability to control tight tolerances, perform micro-vias and fine line spacing in substrate routing, which may reduce the footprint and possibly reduce the total number of layers of camera module 100. Reducing the thickness of the substrate can reduce the overall height of the module. Electronic components 128 are passive electronic components that are coupled to exposed portions of traces 110 on image sensor end 104 of flexible interconnect tape 102, according to an embodiment. Electronic components 128 may be soldered onto flexible interconnect tape 102 using, for example, a gold (Au) and tin (Sn) alloy solder paste. Electronic components 128 may include capacitors, resistors, inductors, and diodes, for example. Electronic components 128 may have a height of 0.2 mm to 0.3 mm, for example. Coupling electronic components 128 to traces 110 electrically couples electronic components 128 to connector 112 that is positioned on connector end 106 through traces 110, according to an embodiment. Electronic components 128 may be coupled to traces 110 using solder paste have a thickness of, for example, 0.05 mm. When implemented with 2 layers (and traces 110) flexible interconnect tape 102 may have a thickness of 0.07 mm. The thickness of the electronic components 128, solder paste, and flexible interconnect tape 102 may be the sum of 0.2 mm, 0.05 mm, and 0.07 mm, which is 0.32 mm, for example.

Figure 2B:
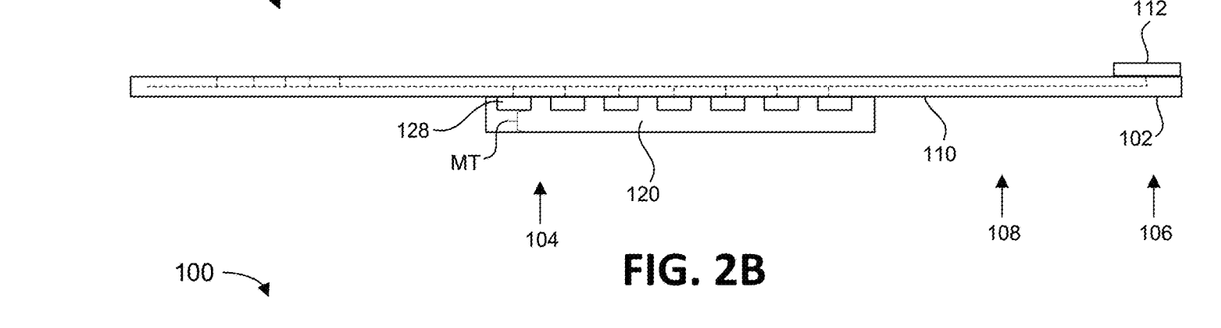

FIG. 2B illustrates the application of molding 120 over electronic components 128, according to an embodiment. Molding 120 covers and protects electronic components 128, according to an embodiment. Molding 120 provides rigidity to image sensor end 104 of flexible interconnect tape 102, according to an embodiment. Molding 120 may also transfer and dissipate heat from flexible interconnect tape 102 and from electronic components 128, which may support maintaining image quality during video mode. A molding thickness MT over electronic components 128 may be, for example, 0.1 mm thick. In one embodiment, molding thickness MT has a value in the range of 0.05 mm-0.2 mm thick. However, the layer of molding 120 will include a thickness of the electronic components 128 in addition to molding thickness MT, so that molding 120 at least partially fills gaps between electronic components 128. Because flexible interconnect tape 102 may have a thickness or height of 0.07 mm, solder paste may be 0.05 mm thick, electronic components 128 may be 0.2 mm thick, and molding thickness MT may be 0.1 mm thick, the total thickness of these portions of camera module 100 may be approximately 0.42 mm thick (e.g., 0.40 mm-0.50 mm).

Figure 2C:
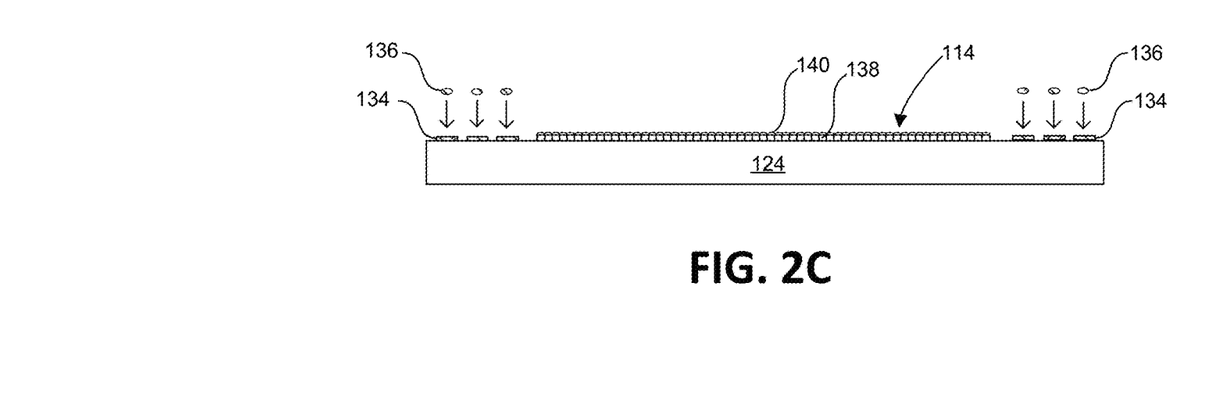

FIG. 2C illustrates coupling bonding bumps 136 to bonding pads 134 of image sensor die 124, according to an embodiment. Bonding bumps 136 may be gold stud bumps, gold plated stud bumps, E-less nickel/gold alloy plated, or another conductive element or alloy. Bonding bumps 136 may be coupled to bonding pads 134 using, for example, a conductive adhesive such as ACP. Bonding bumps 136 may have a non-spherical shape, may be partially conical, or may be spherical (e.g., similar to a solder ball), according to various embodiments. Bonding bumps 136 may have a stack height of 0.03 mm, for example.

Figures 2D, 2E:
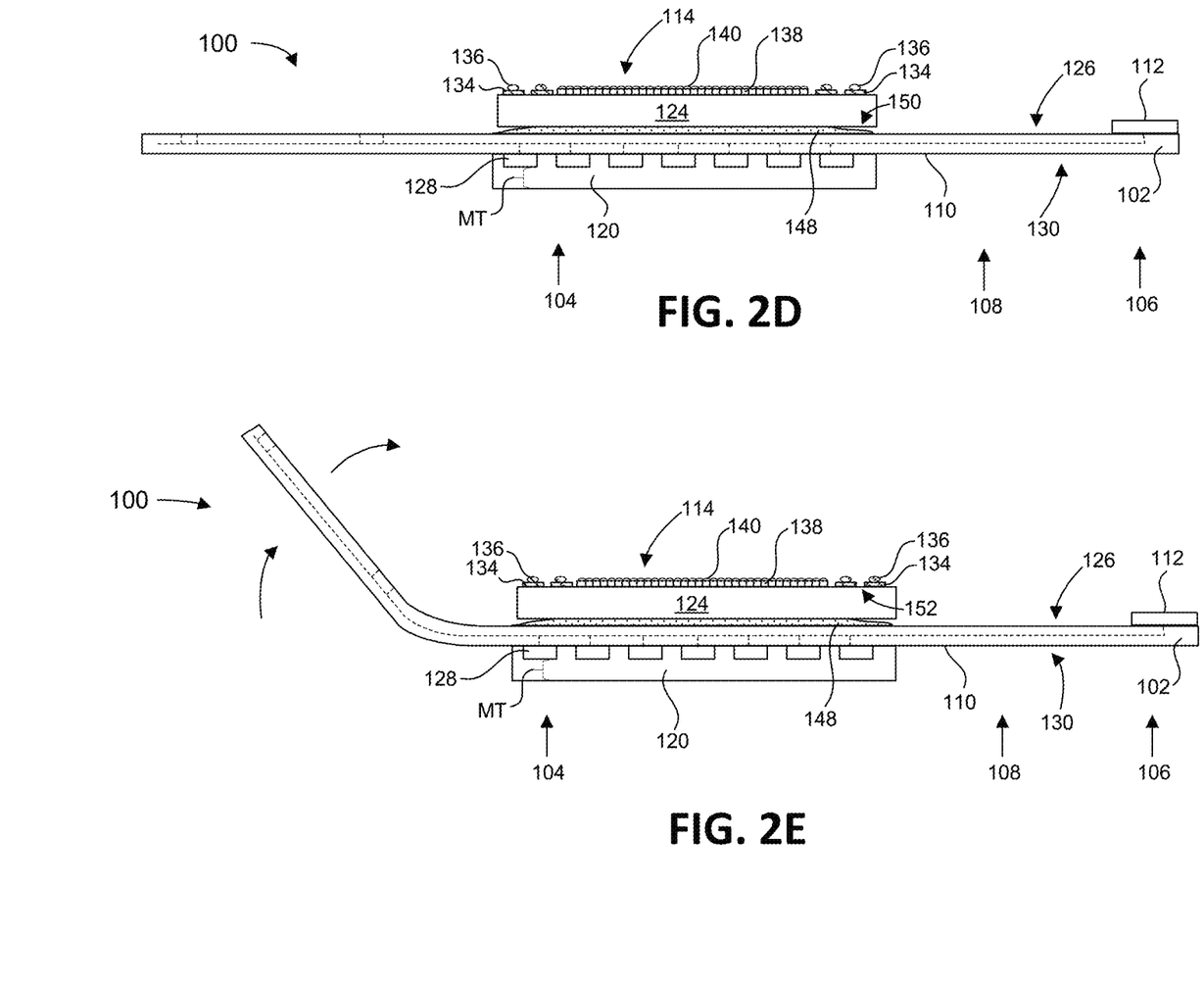

FIG. 2D illustrates coupling image sensor die 124 to first side 126 of flexible interconnect tape 102, according to an embodiment. Bottom side 150 of image sensor die 124 may be coupled to flexible interconnect tape 102 using adhesive layer 148, which may be dispensed by thermo-set or thermoplastic adhesive, according to an embodiment. Image sensor die 124 may have a thickness of 0.30 mm.

FIG. 2E illustrates flexible interconnect tape 102 being folded over or bent around image sensor die 124, according to an embodiment. Flexible interconnect tape 102 is folded over to partially cover top side 152 of image sensor die 124, according to an embodiment. Flexible interconnect tape 102 may have a bend radius of 1.5 times the thickness of flexible interconnect tape 102, so the bend radius may be 1.5 times 0.07 mm, which is approximately 0.105 mm. Flexible interconnect tape 102 includes opening 116, but flexible interconnect tape 102 does not illustrate opening 116 in FIG. 2E to more clearly illustrate the manipulation of the tape.

Figure 2F:
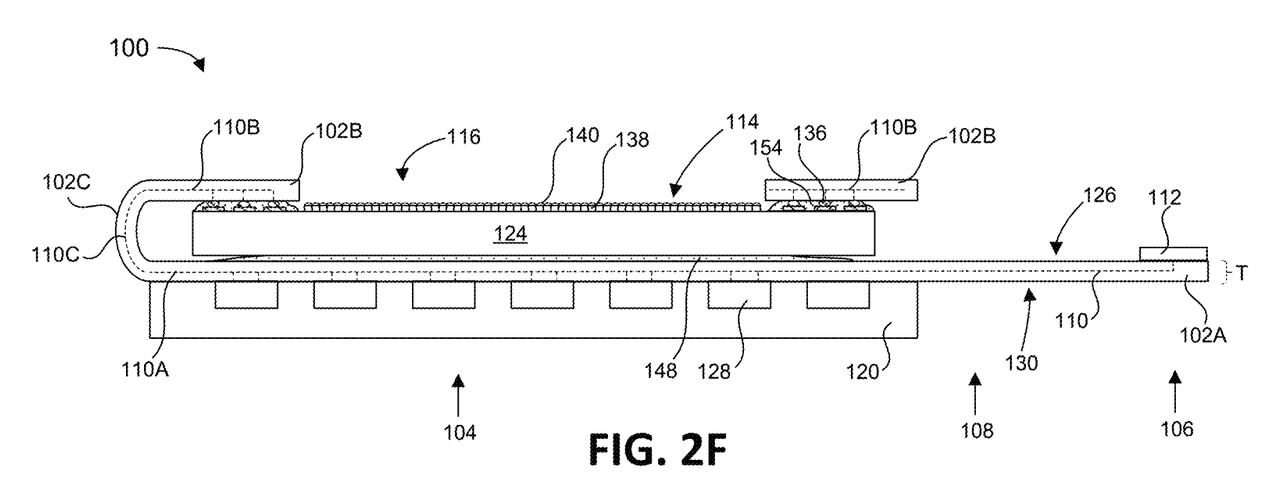

FIG. 2F illustrates the bonding of image sensor die 124 to flexible interconnect tape 102B, according to an embodiment. Image sensor die 124 may be bonded to flexible interconnect tape 102B using thermo-sonic (TS) bonding or thermo-compression (TC) bonding, according to embodiments. TC bonding force can be reduced because bonding on a flexible tape surface can be performed with less force than needed for printed circuit board (PCB) materials. Additionally, a thinner die can be used due to better coefficient of thermal expansion (CTE) between tape and silicon and reduced bonding force. TS and TC bonding may include applying underfill layer 154, which may be a conductive epoxy, a non-conductive paste (NCP), or an anisotropic conductive paste (ACP). TS bonding may then include concurrently applying heat with an ultrasonic signal to bond bonding bumps 136 to flexible interconnect tape 102B and to cure the epoxy, NCP, or ACP. TC bonding, however, may include applying heat with compression to bond bonding bumps 136 to flexible interconnect tape 102B, according to an embodiment.

The total height of camera module may include a combined thickness of the various components coupled together and illustrated in FIGS. 2A-2F, according to an embodiment. For example, the stack height or thickness of the camera module may be the sum of 0.07 mm for flexible interconnect tape 102A, 0.30 mm for image sensor die 124, 0.03 mm for bonding bumps 136, 0.07 mm for flexible interconnect tape 102B, 0.05 mm for solder paste for passive electronic components 128, 0.20 mm for passive electronic components 128, 0.10 mm mold thickness MT over passive electronic components 128. The stack height may have a total thickness of 0.82 mm.

Figure 2G:
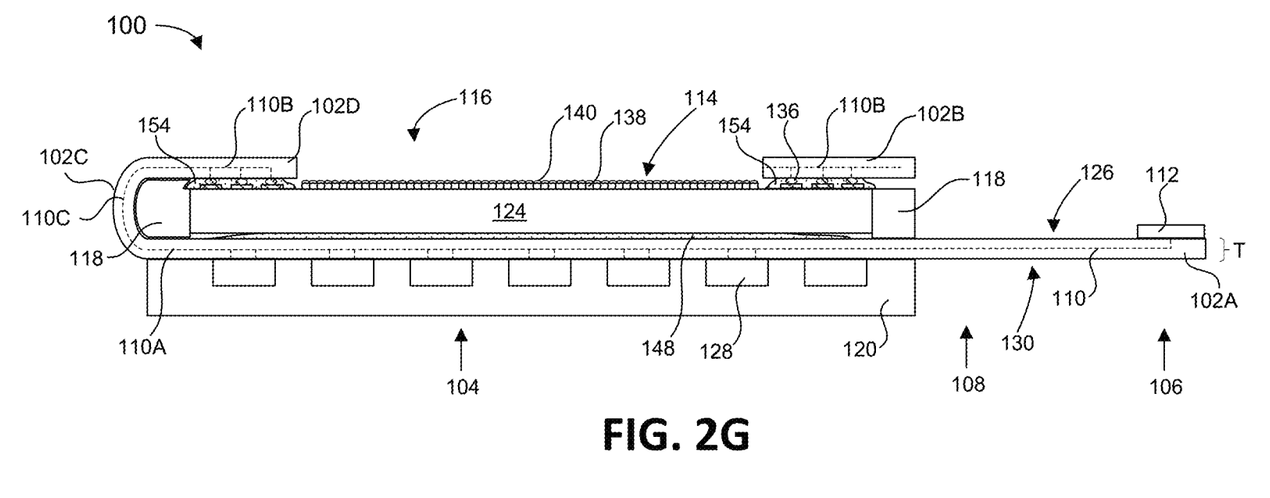

FIG. 2G illustrates applying molding 118 around a periphery of portions of image sensor die 124, according to an embodiment. A mold structure may be positioned around image sensor die 124 and camera module 100, and the mold structure may enable mold compound to be transferred around image sensor die 124. As illustrated, molding 118 may fill portions of the cavity between image sensor die 124 and flexible interconnect tape 102C, for example. While molding 118 is applied, a number of image sensor dice may be restrained by a framework (e.g., framework 400 or 402 shown in FIG. 4) that enables automated fabrication of numerous camera modules at the same time. The camera modules may be singulated (e.g., individually separated from the framework) after receiving molding 118 or after another process, according to various embodiments.

Figure 2H:
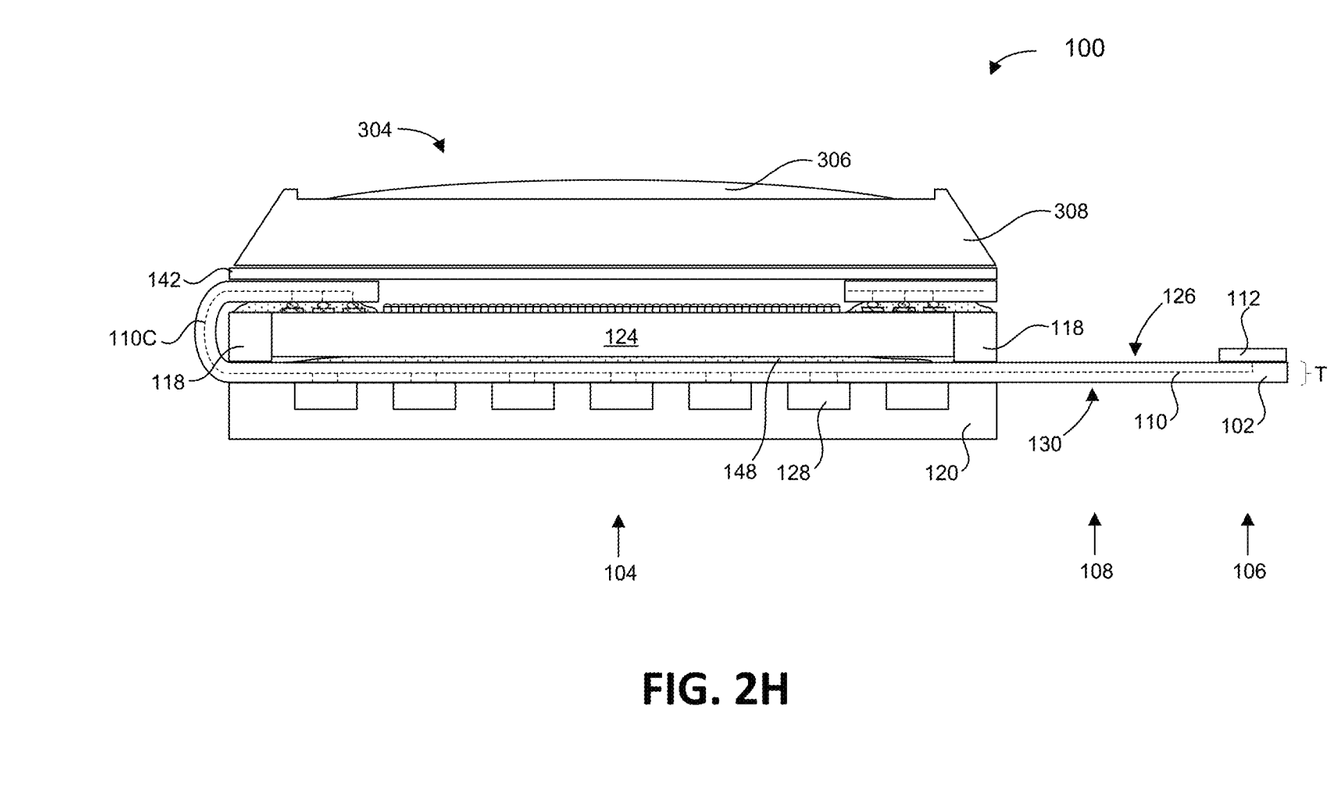

FIG. 2H illustrates the addition of a lens assembly 304 to camera module 100, according to an embodiment. Lens assembly 304 may be configured to focus incident light onto pixel array 114. Lens assembly 304 may include a lens 306 and a body 308 that suspends lens 306 a pre-determined distance from pixel array 114, according to an embodiment. Lens assembly 304 may be attached using an active alignment (AA) process, which includes use of machine vision, pictures of camera modules, and/or alignment markers on portions of camera module 100, in an embodiment. Lens assembly 304 may be coupled to cover glass 142, which may be positioned over pixel array 114 to protect pixel array 114, according to an embodiment. Cover glass 142 may be adhered to flexible interconnect tape 102 with an adhesive, according to an embodiment.

Figure 3:
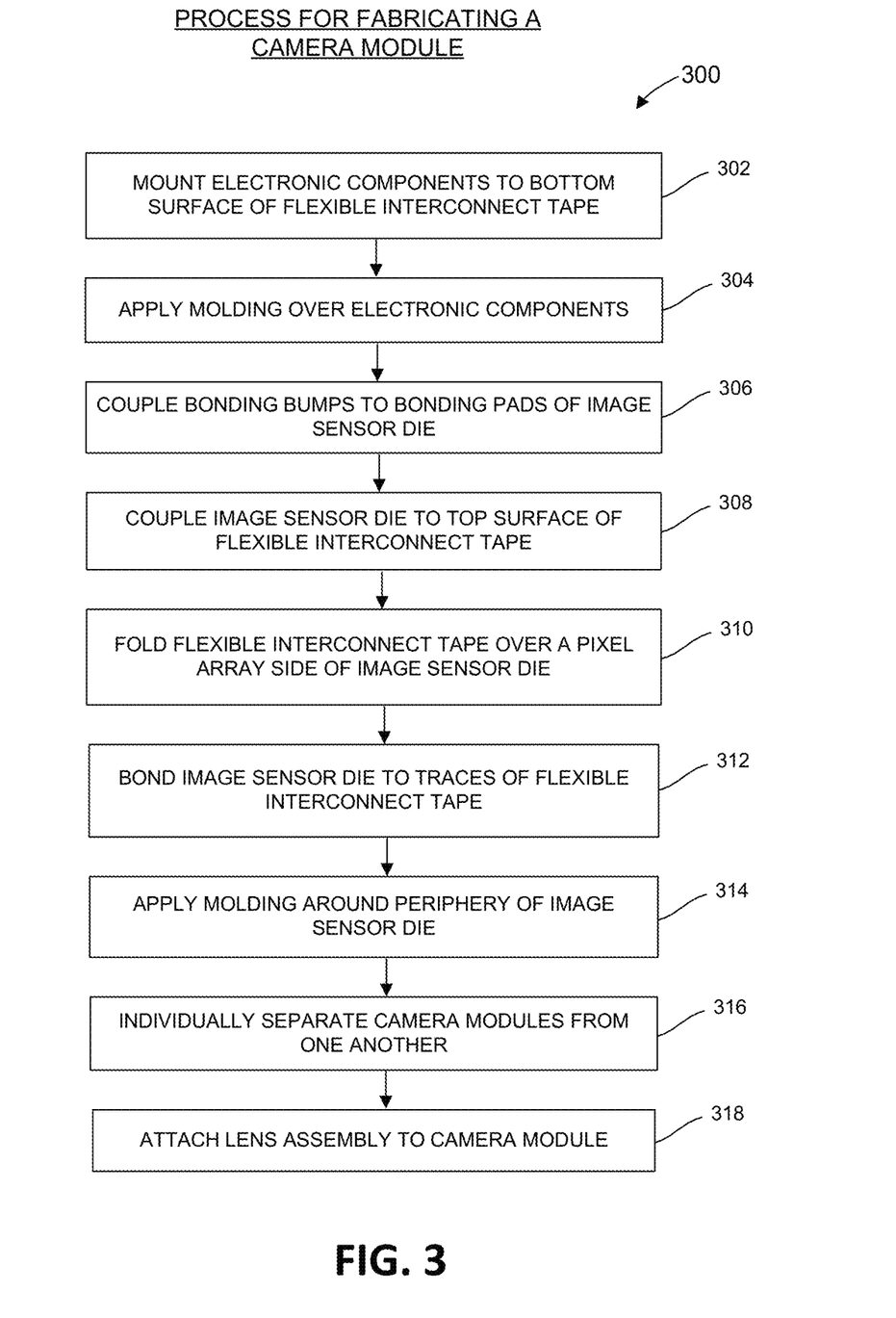
FIG. 3 illustrates process for fabricating a camera module using flexible interconnect tape folded over an image sensor die, in accordance with aspects of the disclosure.

FIG. 3 illustrates process 300 for fabricating a camera module using flexible interconnect tape folded over a wire bond image sensor die, in accordance with aspects of the disclosure. The order in which some or all of the process blocks appear in process 300 should not be deemed limiting.

Rather, one of ordinary skill in the art having the benefit of the present disclosure will understand that some of the process blocks may be executed in a variety of orders not illustrated, or even in parallel.

At process block 302, process 300 mounts electronic components to a bottom surface of a flexible interconnect tape, according to an embodiment. Process block 302 proceeds to process block 304, according to an embodiment.

At process block 304, process 300 applies molding over the electronic components, according to an embodiment. Process block 304 proceeds to process block 306, according to an embodiment.

At process block 306, process 300 couples bonding bumps (e.g., gold stud bumps) to bonding pads of an image sensor die, according to an embodiment. The bonding pads may be on a surface that includes the pixel array, according to an embodiment. Process block 306 proceeds to process block 308, according to an embodiment.

At process block 308, process 300 couples image sensor die to a top surface of the flexible interconnect tape, according to an embodiment. The bottom side (e.g., non-pixel array side) of the image sensor die may be coupled to the flexible interconnect tape with an adhesive. Process block 308 proceeds to process block 310, according to an embodiment.

At process block 310, process 300 folds flexible interconnect tape over a pixel array side of the image sensor die, according to an embodiment. The flexible interconnect tape may include an opening that operates as a window to pass light onto the pixel array. Process block 310 proceeds to process block 312, according to an embodiment.

At process block 312, process 300 bonds image sensor die to traces of flexible interconnect tape, according to an embodiment. Process 300 may include TS bonding or TC bonding to electrically couple the bonding pads of the image sensor die to exposed traces of the flexible interconnect tape. Process block 312 proceeds to process block 314, according to an embodiment.

At process block 314, process 300 applies molding around a periphery of the image sensor die, according to an embodiment. Process block 314 proceeds to process block 316, according to an embodiment.

At process block 316, process 300 individually separates camera modules from one another, according to an embodiment. Process block 316 proceeds to process block 318, according to an embodiment.

At process block 318, process 300 attaches a lens assembly to the camera module. Process 300 may terminate after process block 318, according to an embodiment.

Figure 4:
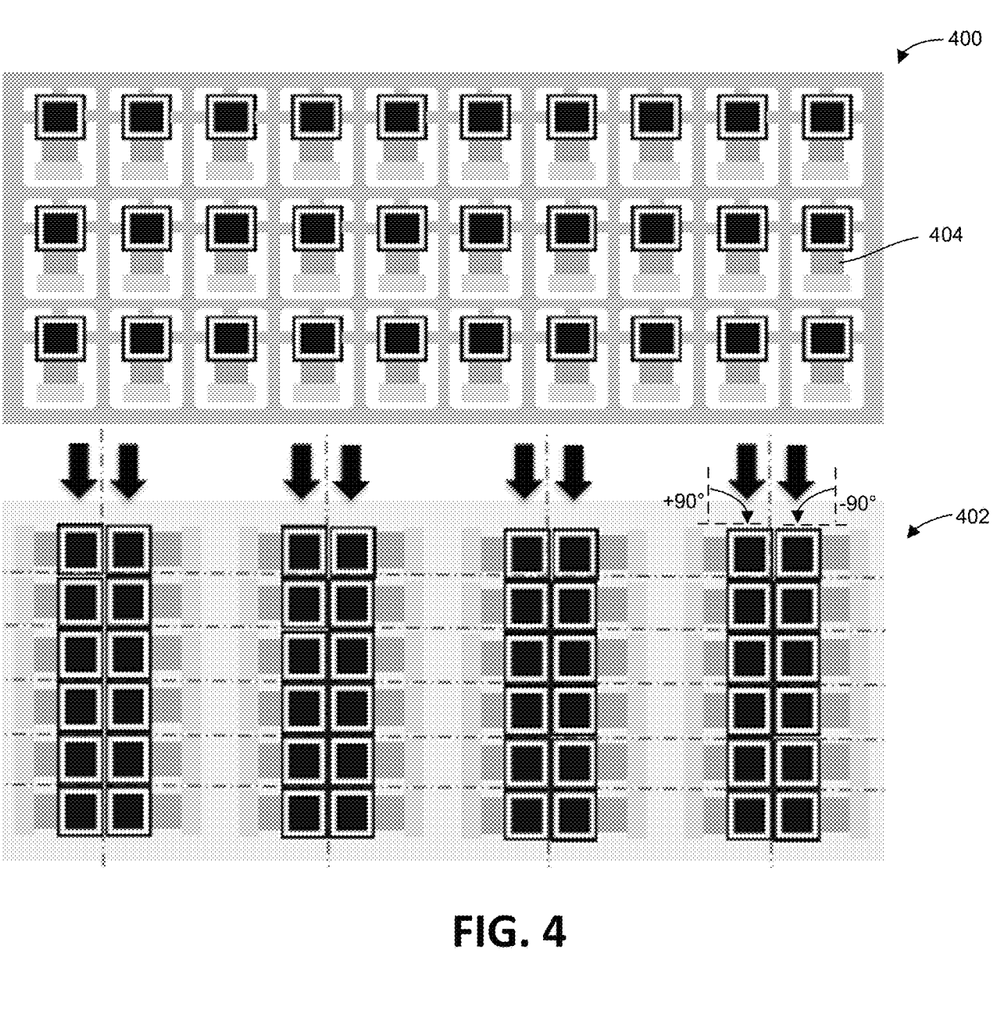
FIG. 4 illustrates two fabrication structures for orienting camera modules during fabrication, in accordance with aspects of the disclosure.

FIG. 4 illustrates a fabrication structure 400 and a fabrication structure 402 for orienting camera modules 404 during fabrication, in accordance with aspects of the disclosure. Fabrication structure 400 carries camera modules 404 with the same orientation. Fabrication structure 402 is an example of an improved manufacturing lattice structure that enables over 50% more camera modules 404 to be fabricated in a similarly sized (e.g., same sized) lattice structure, according to an embodiment. For example, fabrication structure 400 may carry 30 modules, whereas fabrication structure 402 may be able to carry 48 modules. Fabrication structure 402 includes camera modules being rotated +90° and −90° so that image sensor ends of the modules are positioned near another image sensor end, for example. Fabrication structure 402 may enable mold compound to be transferred from a single side rail or gate to inject molding material onto all of the camera modules carried by fabrication structure 402, according to an embodiment.

Figure 5:
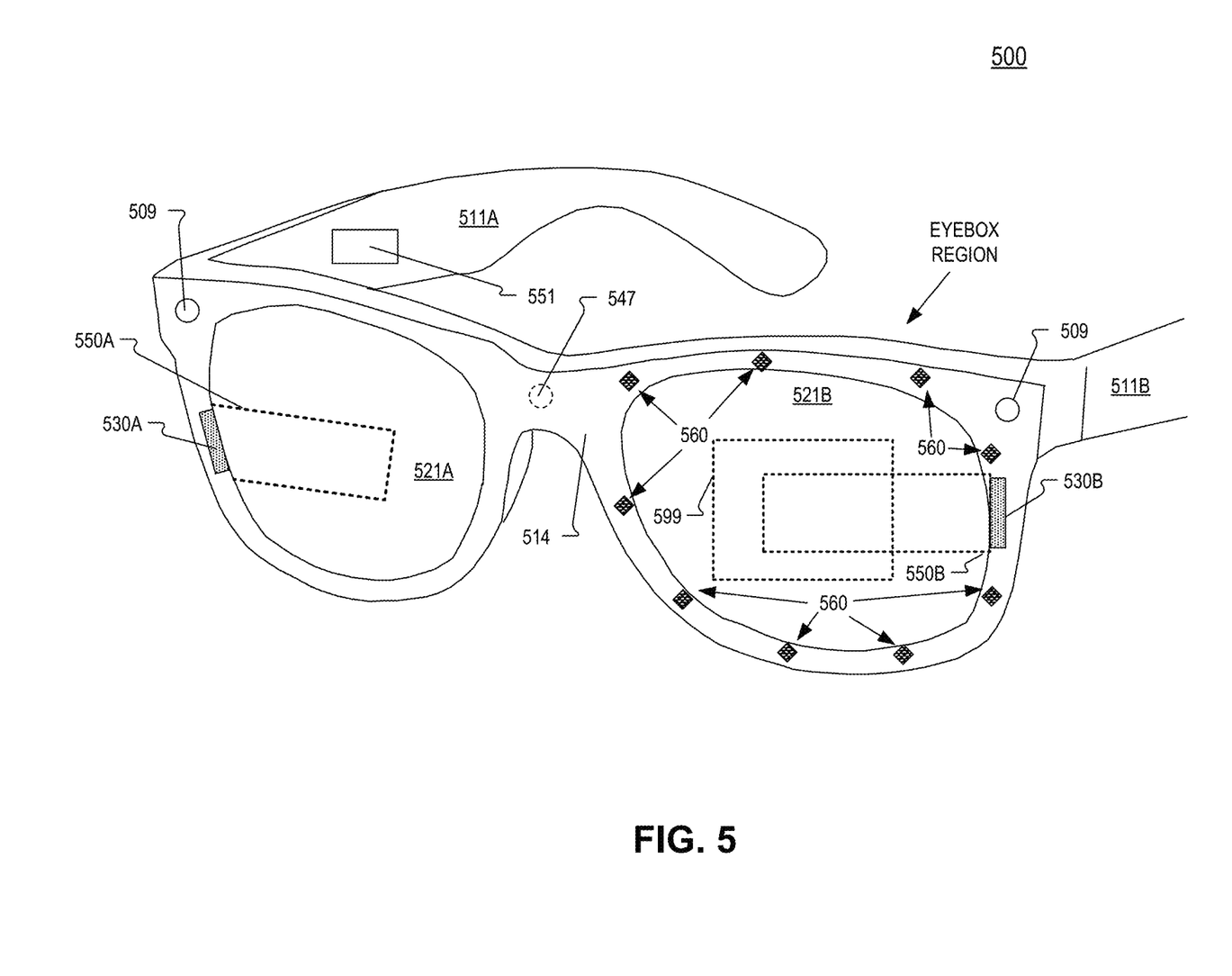
FIG. 5 illustrates a head mounted display (HMD) that includes a camera module fabricated with flexible interconnect tape, in accordance with aspects of the disclosure.

FIG. 5 illustrates a head mounted display (HMD) 500 that includes a camera module 509 fabricated with flexible interconnect tape, in accordance with aspects of the disclosure. Camera module 509 is an example implementation of camera module 100 (shown in FIGS. 1A-2H), according to an embodiment. HMD 500 includes frame 514 coupled to arms 511A and 511B. Lenses 521A and 521B are mounted to frame 514. Lenses 521 may be prescription lenses matched to a particular wearer of HMD or non-prescription lenses. The illustrated HMD 500 is configured to be worn on or about a head of a user of the HMD.

In FIG. 5, each lens 521 includes a waveguide 550 to direct image light generated by a display 530 to an eyebox region for viewing by a wearer of HMD 500. Display 530 may include an LCD, an organic light emitting diode (OLED) display, micro-LED display, quantum dot display, pico-projector, or liquid crystal on silicon (LCOS) display for directing image light to a wearer of HMD 500.

The frame 514 and arms 511 of the HMD 500 may include supporting hardware of HMD 500. HMD 500 may include any of processing logic 551, wired and/or wireless data interface for sending and receiving data, graphic processors, and one or more memories for storing data and computer-executable instructions. In one embodiment, HMD 500 may be configured to receive wired power. In one embodiment, HMD 500 is configured to be powered by one or more batteries. In one embodiment, HMD 500 may be configured to receive wired data including video data via a wired communication channel. In one embodiment, HMD 500 is configured to receive wireless data including video data via a wireless communication channel.

Lenses 521 may appear transparent to a user to facilitate augmented reality or mixed reality where a user can view scene light from the environment around her while also receiving image light directed to her eye(s) by waveguide(s) 550. Consequently, lenses 521 may be considered (or include) an optical combiner. In some embodiments, image light is only directed into one eye of the wearer of HMD 500. In an embodiment, both displays 530A and 530B are included to direct image light into waveguides 550A and 550B, respectively.

The example HMD 500 of FIG. 5 includes an array of infrared emitters (e.g. infrared LEDs) 560 disposed around a periphery of lens 521B in frame 514. The infrared emitters emit light in an eyeward direction to illuminate an eye of a wearer of HMD 500 with infrared light. In one embodiment, the infrared light is centered around 850 nm. Infrared light from other sources may illuminate the eye as well. The infrared light may reflect off the eye and be received by a Fresnel reflector 599 selectively coated with a hot mirror and configured to direct and focus the reflected infrared light to camera 547. Fresnel reflector 599 may have an off-axis Fresnel lensing shape to direct the reflected infrared light to camera 547. In this way, camera 547 is able to image the eye of a wearer of HMID 500. Camera 547 may be mounted on the inside of the temple of HMD 500. The images of the eye captured by camera 547 may be used for eye-tracking purposes. Although camera 547, infrared emitters 560, and Fresnel reflector 599 are illustrated on only one side of HMD 500, they of course may be duplicated on the other side of HMD 500 to facilitate infrared imaging of both eyes of a wearer of HMD 500.

Camera module 509 may be outward facing to support HMD 500 operations. For example, camera module 509 may be used to provide pass-through imaging that enables a user to temporarily see the surrounding environment prior to, for example, engaging in fully immersive VR experiences.

Camera module 509 may be outward facing to support artificial intelligence (AI) identification of one or more people, places, landmarks, and/or objects in an environment, according to an embodiment. Camera 547 and camera module 509 may be example implementations of the embodiments of camera modules disclosed throughout the present disclosure.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The term "processing logic" in this disclosure may include one or more processors, microprocessors, multi-core processors, Application-specific integrated circuits (ASIC), and/or Field Programmable Gate Arrays (FPGAs) to execute operations disclosed herein. In some embodiments, memories (not illustrated) are integrated into the processing logic to store instructions to execute operations and/or store data. Processing logic may also include analog or digital circuitry to perform the operations in accordance with embodiments of the disclosure.

A "memory" or "memories" described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

Communication channels may include or be routed through one or more wired or wireless communication utilizing IEEE 802.11 protocols, BlueTooth, SPI (Serial Peripheral Interface), I²C (Inter-Integrated Circuit), USB (Universal Serial Port), CAN (Controller Area Network), cellular data protocols (e.g. 3G, 4G, LTE, 5G), optical communication networks, Internet Service Providers (ISPs), a peer-to-peer network, a Local Area Network (LAN), a Wide Area Network (WAN), a public network (e.g. "the Internet"), a private network, a satellite network, or otherwise.

A computing device may include a desktop computer, a laptop computer, a tablet, a phablet, a smartphone, a feature phone, a server computer, or otherwise. A server computer may be located remotely in a data center or be stored locally.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A camera module, comprising:
   an image sensor die having a first side and a second side, wherein the first side includes a pixel array, wherein the second side is opposite to the first side;
   high-density interconnect (HDI) tape configured to at least partially enclose the image sensor die, wherein the HDI tape is folded over the first side of the image sensor die and the second side of the image sensor die, wherein the HDI tape includes a plurality of flexible layers of insulator material, a plurality of traces, a first side, and a second side, wherein the first side of the HDI tape is electrically coupled to the first side of the image sensor; and
   a plurality of passive electronic components electrically coupled to the second side of the HDI tape.

2. The camera module of claim 1 further comprising:
   a layer of molding disposed on the second side of the HDI tape, wherein the layer of molding is disposed over the plurality of passive electronic components, wherein the layer of molding is configured to provide rigidity to at least part of the camera module.

3. The camera module of claim 2, wherein a thickness of a portion of the layer of molding that covers the plurality of passive electronic components is approximately 0.1 mm, wherein a combined thickness of one of the plurality of passive electronic components and the layer molding is approximately 0.3-0.4 mm.

4. The camera module of claim 1, wherein the HDI tape includes an opening aligned with the pixel array, wherein the opening is configured to pass light onto the pixel array.

5. The camera module of claim 1 further comprising:
a layer of molding disposed on the first side of the HDI tape, wherein the layer of molding is at least partially disposed around a periphery of the image sensor die.

6. The camera module of claim 1, wherein the image sensor die is configured as a wire bond die, wherein image sensor die includes a plurality of bonding pads disposed on the first side of the image sensor die.

7. The camera module of claim 6, wherein at least some of the plurality of traces are exposed on the first side of the HDI tape, wherein the at least some of the plurality of traces are electrically coupled to at least some of the plurality of bonding pads.

8. The camera module of claim 1 further comprising:
a plurality of bonding bumps positioned between the image sensor die and the HDI tape to electrically couple the image sensor die to the HDI tape; and
an underfill deposited between the image sensor die and the HDI tape.

9. The camera module of claim 1, wherein the passive electronic components include one or more of capacitors, resistors, and inductors.

10. The camera module of claim 1, wherein the HDI tape has a thickness of approximately 0.07-0.18 mm.

11. A head mounted device, comprising:
a frame;
a lens assembly coupled to the frame and configured to pass light into an eyebox region;
a camera module coupled to the frame, wherein the camera module includes:
an image sensor die having a first side, a second side, and a third side, wherein the first side includes a pixel array, wherein the second side is parallel to the first side, wherein the third side is perpendicularly coupled between the first and second sides;
a flexible interconnect tape including a plurality of traces, a first surface, and a second surface, wherein the first surface of the flexible interconnect tape is electrically coupled to the first side, is coupled to the second side, and is bent around the third side; and
a plurality of passive electronic components electrically coupled to the second surface of the flexible interconnect tape; and
one or more processors coupled to the camera module and configured to receive image data from the camera module.

12. The head mounted device of claim 11 further comprising:
a layer of molding disposed on the second side of the flexible interconnect tape, wherein the layer of molding is disposed over the plurality of passive electronic components, wherein the layer of molding is configured to provide rigidity to at least part of the camera module.

13. The head mounted device of claim 11, wherein the flexible interconnect tape includes an opening configured to pass light onto the pixel array.

14. The head mounted device of claim 11 further comprising:
a layer of molding disposed around a periphery of the image sensor die.

15. The head mounted device of claim 11, wherein image sensor die includes a plurality of bonding pads disposed on the first side of the image sensor die, wherein at least some of the plurality of traces are electrically coupled to at least some of the plurality of bonding pads.

16. The head mounted device of claim 11 further comprising:
a plurality of bonding bumps positioned between the first side of the image sensor die and the flexible interconnect tape to electrically couple the image sensor die to the flexible interconnect tape.

17. The head mounted device of claim 11, wherein the flexible interconnect tape has a thickness of approximately 0.07-0.18 mm.

18. A method of fabricating a camera module using high density interconnect (HDI) tape, the method comprising:
electrically coupling a plurality of passive electronic components to a first surface of the HDI tape,
wherein the HDI tape includes flexible layers of insulator material and a plurality of conductive traces disposed between at least two layers of the flexible layers of insulator material; and
coupling a second surface of the HDI tape to a first side and a second side of an image sensor die by bending the HDI tape around a third side of the image sensor die, the second surface different from the first surface, wherein the first side of the image sensor includes a pixel array, wherein the second side of the image sensor is parallel to the first side, wherein the third side of the image sensor die is coupled between the first and second sides of the image sensor die.

19. The method of claim 18, wherein coupling the second surface of the HDI tape to the first side of the image sensor die includes thermo-sonic bonding or thermo-compression bonding the image sensor die to the second surface of the HDI tape, wherein a plurality of bonding bumps are positioned between the image sensor die and the second surface of the HDI tape.

20. The method of claim 18 further comprising:
depositing molding on the first surface of the HDI tape to cover the plurality of passive electronic components.

* * * * *